(12) United States Patent
Iwanari et al.

(10) Patent No.: US 7,085,148 B2
(45) Date of Patent: Aug. 1, 2006

(54) SEMICONDUCTOR MEMORY DEVICE

(75) Inventors: Shunichi Iwanari, Soraku-gun (JP);
Masahiko Sakagami, Kameoka (JP);
Yasuo Murakuki, Kyotanabe (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 173 days.

(21) Appl. No.: 10/937,441

(22) Filed: Sep. 10, 2004

(65) Prior Publication Data

US 2005/0078547 A1    Apr. 14, 2005

(30) Foreign Application Priority Data

Oct. 14, 2003    (JP)   ............................... 2003-354096

(51) Int. Cl.
*G11C 7/06*    (2006.01)
(52) U.S. Cl. ..................... 365/63; 365/185.2; 365/203; 365/210
(58) Field of Classification Search .................. 365/63, 365/185.2, 210, 203
See application file for complete search history.

(56) References Cited

U.S. PATENT DOCUMENTS

| 5,062,077 | A | 10/1991 | Takashima et al. |
| 5,214,601 | A | 5/1993 | Hidaka et al. |
| 6,707,701 | B1 | 3/2004 | Ashikaga |
| 6,721,198 | B1 | 4/2004 | Kang |
| 2003/0063508 | A1 | 4/2003 | Ashikaga |
| 2003/0099125 | A1 | 5/2003 | Kang |
| 2005/0157531 | A1* | 7/2005 | Yamaoka et al. ........... 365/145 |

FOREIGN PATENT DOCUMENTS

WO    WO 97/36300    10/1997

OTHER PUBLICATIONS

Kawai, Tomoji, "IC memory that does not lose its data—all about FRAM-(Kienai IC memory-FRAM no subete-)" Jun. 22, 1998, Second Impression of the First Edition, pp. 29-33.

* cited by examiner

*Primary Examiner*—Richard Elms
*Assistant Examiner*—Pho M. Luu
(74) *Attorney, Agent, or Firm*—McDermott Will & Emery LLP (57) ABSTRACT

A semiconductor memory device having a semiconductor substrate includes a plurality of reference cells 4 and a plurality of bit lines 10. The reference cells 4 are formed in a region near the centerline of a predetermined region of the semiconductor substrate which is perpendicular to the bit lines 10. The bit lines 10 form pairs each composed of two adjacent bit lines. Two bit lines 10 in each pair have a first parallel state and a second parallel state in which positions of the two bit lines are reversed from the first parallel state. Each pair of bit lines 10 has at least one cross section 11 where one of the pair of bit lines 10 crosses the other, to switch between the first parallel state and the second parallel state. The cross section 11 is provided in the predetermined region of the semiconductor substrate such that the length of a bit line 10 in the first parallel state is equal to the length of the bit line 10 in the second parallel state. The semiconductor memory device is reduced in size.

7 Claims, 6 Drawing Sheets

SEMICONDUCTOR MEMORY DEVICE

BACKGROUND OF THE INVENTION

1. Field of the Invention

The present invention relates to a semiconductor memory device, and more particularly to a semiconductor memory device in which 1T1C memory cells are arranged in a matrix form on a semiconductor substrate.

2. Description of the Background Art

A ferroelectric memory is a nonvolatile memory that allows for fast write at low voltages, and is capable of retaining its data even when the power is turned off. Thus, the ferroelectric memory has started to be applied to data storage devices that require fast data rewrite and low power consumption operation, as a substitute for a device composed of SRAM and a battery.

In recent years, an attempt has been made to produce larger capacity, smaller ferroelectric memories. An example of large-capacity ferroelectric memories includes a ferroelectric memory employing the so-called 1T1C cells. The 1T1C cell consists of one transistor and one capacitor and stores one bit of data. On the other hand, a commonly-used 2T2C cell stores one bit of data with two transistors and two capacitors. Thus, a ferroelectric memory employing 1T1C cells can offer a capacity about twice that of a ferroelectric memory employing 2T2C cells, with equal size (see, for example, "IC memory that does not lose its data—all about FRAM—(*Kienai IC memory—FRAM no subete* —)", by Tomoji Kawai, page 29, Kogyo Chosakai Publishing Co., Ltd., Japan, Jun. 22, 1998, Second Impression of the First Edition).

The operation of evaluating data in a ferroelectric memory employing 11C cells will be briefly described below. The ferroelectric memory employing 11C cells uses a reference potential to evaluate data. The reference potential is the mid-potential between the potential of a bit line obtained when reading data "1" from a memory cell and the potential of a bit line obtained when reading data "0" from a memory cell.

When reading data from a memory cell, first, the potential of the memory cell is read through a first bit line to which the memory cell is connected. Then, a reference potential is read through a second bit line which is a counterpart of the first bit line. The difference between the potential of the first bit line and the reference potential of the second bit line is amplified by a sense amplifier to which the first and second bit lines are connected. If the output of the sense amplifier is positive, the data stored in the memory cell is evaluated as "1". If the output of the sense amplifier is negative, the data stored in the memory cell is evaluated as "0".

Note that the output of the sense amplifier is positive when the potential of the first bit line is higher than the reference potential, or when the output voltage of the sense amplifier is in the neighborhood of the power supply voltage, or when the output voltage of the sense amplifier is relatively high compared to the output voltage of the sense amplifier when the output is negative. The output of the sense amplifier is negative when the potential of the first bit line is lower than the reference potential, or when the output voltage of the sense amplifier is in the neighborhood of the ground voltage, or when the output voltage of the sense amplifier is relatively low compared to the output voltage of the sense amplifier when the output is positive.

As techniques for generating the reference potential, a dummy cell technique is widely used (see, for example, "IC memory that does not lose its data—all about FRAM—(*Kienai IC memory—FRAM no subete*—)", by Tomoji Kawai, page 33, Kogyo Chosakai Publishing Co., Ltd., Japan, Jun. 22, 1998, Second Impression of the First Edition). The dummy cell technique is as follows. Data "1" and data "0" are previously written to two memory cells, respectively (hereinafter referred to as the "reference cells") which have the same structure as memory cells for storing data. The potentials of the reference cells are read through two bit lines. Finally, an equalization circuit takes the average of the potentials obtained through the two bit lines, thereby generating a reference potential. By this, the reference potential which is the mid-potential between the potential of data "0" and the potential of data "1" can be obtained.

Figure 4:
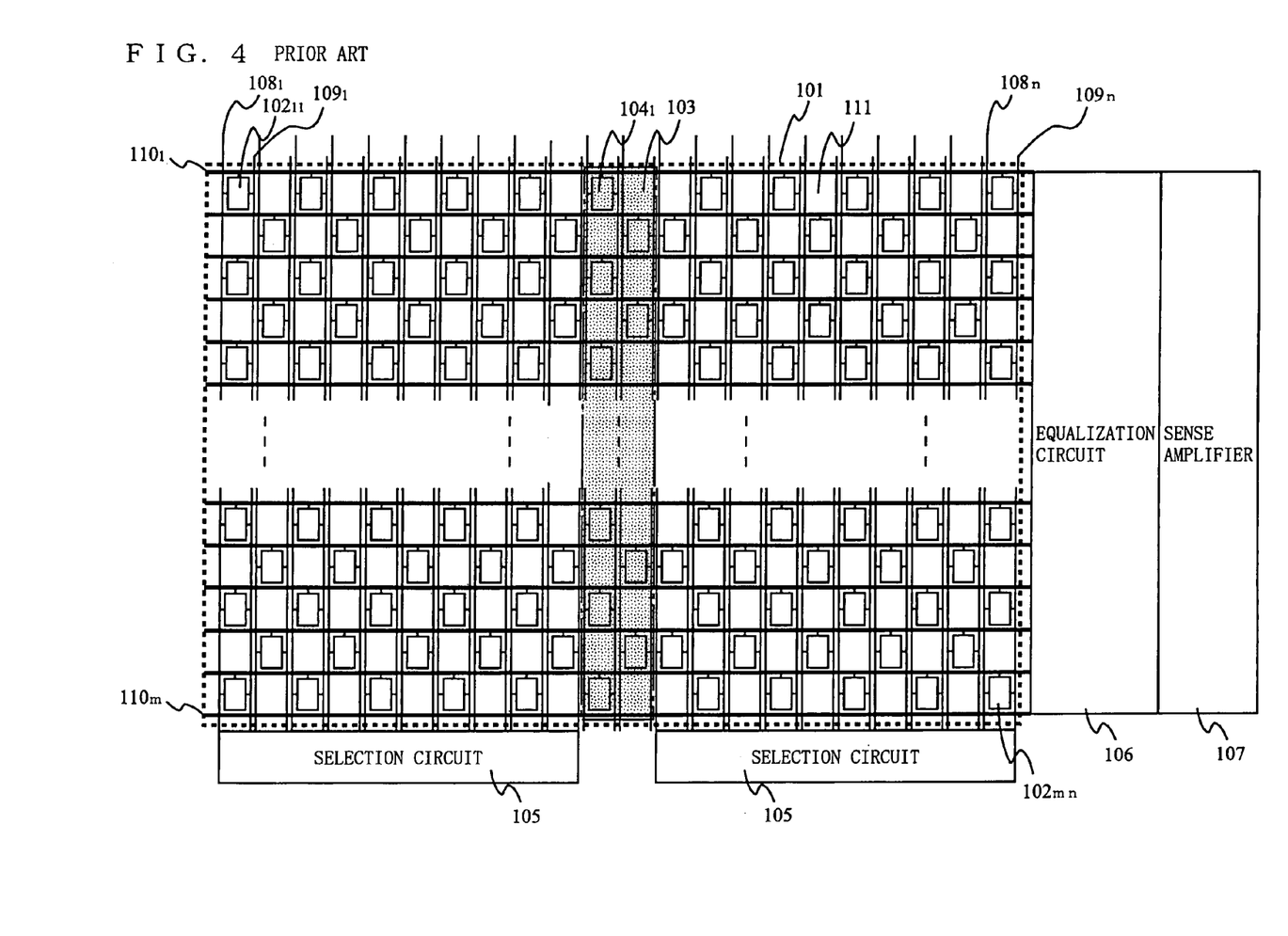
FIG. 4 is a diagram illustrating the entire configuration of a conventional semiconductor memory device.

FIG. 4 is a diagram illustrating the entire configuration of a conventional semiconductor memory device. The reference cells are memory cells used to generate a reference potential which serves as the reference for data evaluation, and thus needs to generate stable potentials. Therefore, reference cells 104 are arranged in the central part of a memory cell region 101 where memory cells 102 have a stable periodic pattern, i.e., a shaded part 103 shown in FIG. 4 (see International Publication No. WO 97/36300). This minimizes variations in characteristics between the reference cells 104, allowing to obtain stable reference potentials.

Figure 5A:
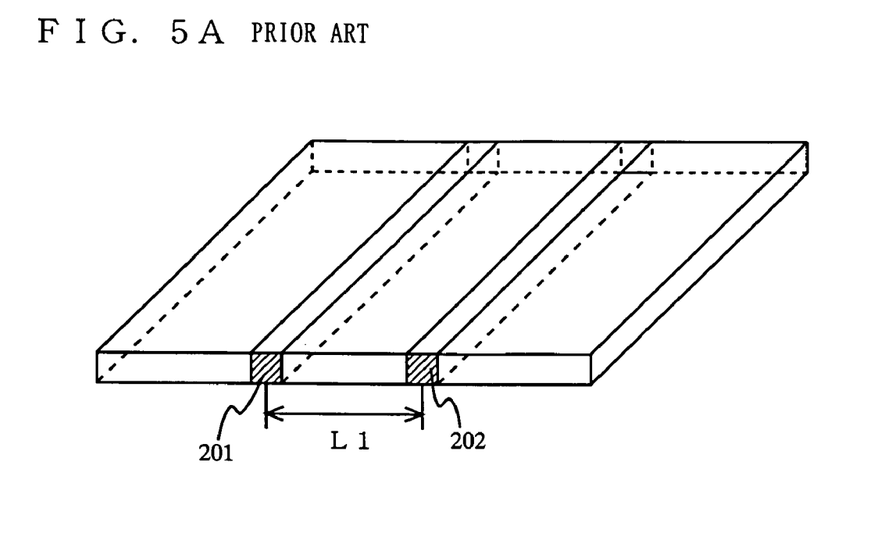
FIG. 5A is a diagram illustrating bit lines arranged in the same layer.
Figure 5B:
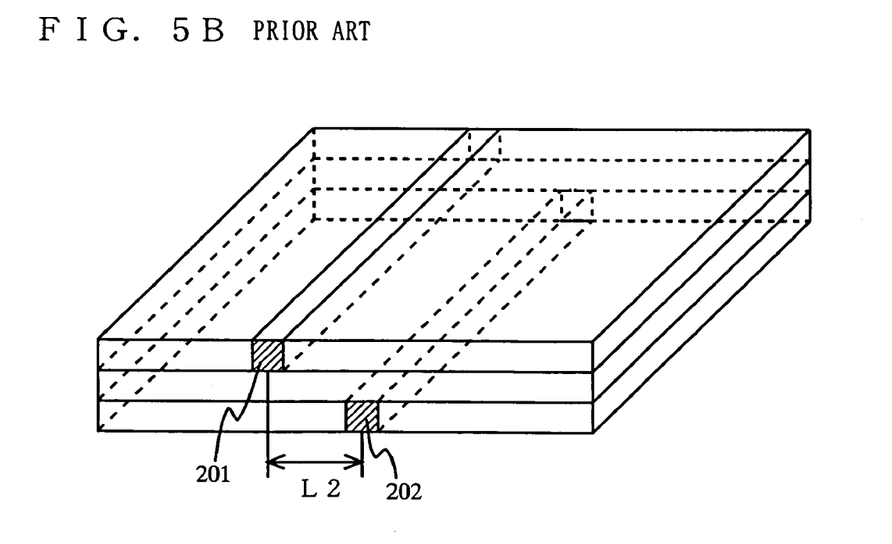
FIG. 5B is a diagram illustrating bit lines arranged in different layers.

In order to reduce the size of a ferroelectric memory, the bit lines may be multi-layered. The technique for reducing the size of a ferroelectric memory will be described below with reference to a drawing. FIG. 5 is a diagram illustrating two bit lines arranged in the same layer; and two bit lines arranged in different layers.

FIG. 5A is a diagram illustrating wiring in which two bit lines 201 and 202 are arranged in the same layer. The two bit lines 201 and 202 need to be arranged with some space therebetween so as to prevent the adverse effects of noise therefrom. Thus, in FIG. 5A, the two bit lines 201 and 202 are arranged with a space L1 therebetween.

On the other hand, as shown in FIG. 5B, when two bit lines 201 and 202 are arranged in different layers, the space between the two bit lines 201 and 202 in a plane can be made to L2 (L1 >L2). Accordingly, it is possible to reduce the size of the ferroelectric memory.

However, when the bit lines 201 and 202 are arranged in different layers, as shown in FIG. 5B, the parasitic capacity generated in the two bit lines may vary between the layers in which the bit lines 201 and 202 are arranged. The variation in parasitic capacity between the bit lines may cause problems such as variation in reference potential.

Figure 6:
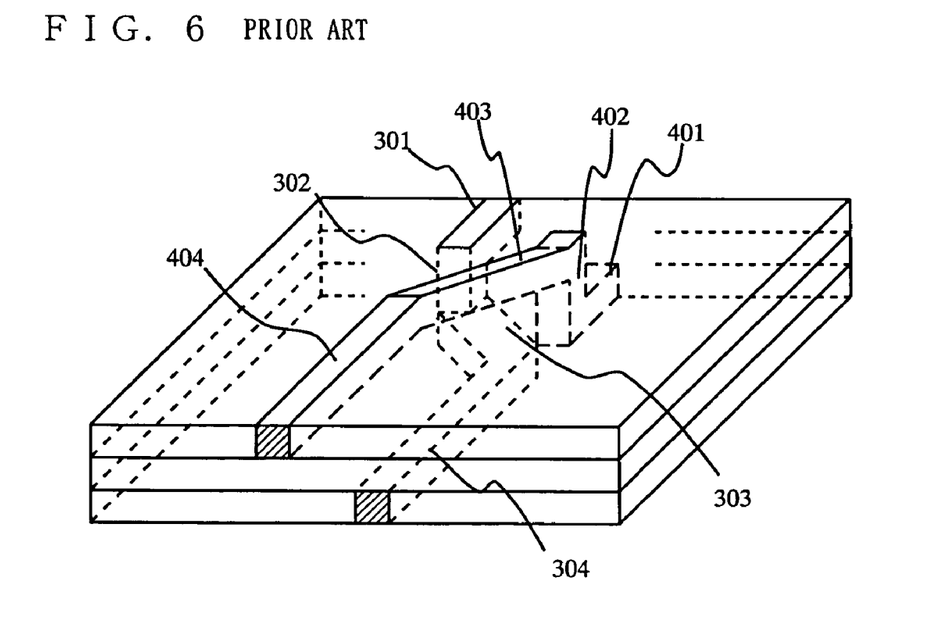
FIG. 6 is a diagram illustrating a cross section.

In order to reduce variation in parasitic capacity, the bit lines may be crossed each other. This technique will be described below with reference to a drawing. FIG. 6 is a diagram illustrating a section (hereinafter referred to as the "cross section") where two lines arranged in different layers are crossed each other.

The aforementioned technique is as follows. Bit lines form pairs each composed of two adjacent bit lines, and two bit lines in each pair are crossed each other so as to reverse the positions of the two lines. As shown in FIG. 6, a line 301 present in the uppermost layer is connected to a contact 302 which connects between the uppermost layer and the lowermost layer. In the lowermost layer the contact 302 is connected to a line 303. The line 303 is arranged in an oblique direction with respect to the line 301 and connected to a line 304 which is parallel with the line 301 and arranged in the lowermost layer.

Further, a line 401 present in the lowermost layer is connected to a contact 402 which connects between the uppermost layer and the lowermost layer. In the uppermost layer the contact 402 is connected to a line 403. The line 403 is arranged in an oblique direction with respect to the line 401 and connected to a line 404 which is parallel with the line 401 and arranged in the uppermost layer. By connecting the lines and the contacts in the above-described manner, the two bit lines are crossed each other, thereby allowing the positions of the two lines to reverse relative to each other.

As shown in FIG. 6, by reversing the positions of the two bit lines, the two bit lines are each allowed to have a parasitic capacitance generated in the uppermost layer and a parasitic capacitance generated in the lowermost layer. This equalizes the parasitic capacities of the two bit lines, and accordingly problems such as variation in reference potential caused by variation in parasitic capacity between the bit lines can be solved.

Typically, the cross section shown in FIG. 6 is provided near the center of a memory cell region. Therefore, if the aforementioned size reduction technique is employed in a ferroelectric memory having reference cells near the center of a memory cell region, the cross sections and the reference cells will be overlapped with each other. Since the cross section has a complicated configuration compared to other sections of bit lines, if the cross sections and the reference cells are overlapped with each other, the periodic pattern of the reference cells may become unstable. That is, a conventional ferroelectric memory having reference cells arranged in a region near the center of bit lines cannot achieve a reduction in size by arranging the bit lines in different layers.

SUMMARY OF THE INVENTION

Therefore, an object of the present invention is to reduce the size of a semiconductor memory device in which the reference cells are arranged in a region near the center of a memory cell region.

The present invention has the following features to attain the object mentioned above. The present invention is directed to a semiconductor memory device having a semiconductor substrate, comprising: a plurality of memory cells for storing data, arranged in a matrix form in a predetermined region of the semiconductor substrate; a plurality of reference cells for generating predetermined potentials to generate a reference potential for evaluating data stored in a memory cell; and a plurality of bit lines through which potentials of the memory cells and the reference cells are read, the bit lines being arranged in parallel with each other. The reference cells are formed in a region near a centerline of the predetermined region of the semiconductor substrate which is perpendicular to the bit lines. The bit lines form pairs each composed of two adjacent bit lines. Two bit lines in each pair have a first parallel state and a second parallel state in which positions of the two bit lines are reversed from the first parallel state. Each pair of bit lines has at least one cross section where one of the pair of bit lines crosses the other, to switch between the first parallel state and the second parallel state. The cross sections are each provided in the predetermined region of the semiconductor substrate such that a length of a bit line in the first parallel state is equal to a length of the bit line in the second parallel state.

Preferably, two bit lines in each pair are formed in different wiring layers.

In addition, it is preferred that the cross sections be provided on the centerline of the predetermined region of the semiconductor substrate, and the reference cells be arranged in regions near the centerline of the predetermined region of the semiconductor substrate and sandwiching a region where the cross sections are provided. A plurality of memory cells for storing data may be arranged in a region of the semiconductor substrate underneath the region where the cross sections are provided. Further, the memory cells arranged in the regions underneath the region where the cross sections are provided may be redundant cells used in the case of a failure of the memory cells arranged in the predetermined region of the semiconductor substrate.

The semiconductor memory device may further comprise an equalization circuit having the plurality of bit lines connected thereto, for taking an average of predetermined potentials of reference cells connected to bit lines other than a bit line to which the memory cell is connected; and a reading section having the plurality of bit lines connected thereto, for reading the data by comparing a potential of the memory cell with the average of the predetermined potentials obtained by the equalization circuit. Preferably, the equalization circuit is arranged between the predetermined region of the semiconductor substrate and the reading section.

In the semiconductor memory device according to the present invention, while the reference cells are arranged in a region near the center of bit lines, the bit lines are allowed to cross each other. Therefore, the semiconductor memory device can be reduced in size while generating stable reference potentials.

Moreover, since the bit lines have a multilayer structure, the space between the bit lines in a plane can be narrowed, resulting in a reduction in the size of the semiconductor memory device.

Since the cross sections are provided on the centerline of the predetermined region of the semiconductor substrate, it may be sufficient for each pair of bit lines to have one cross section. This facilitates the formation of bit lines.

Memory cells are arranged underneath a region where the cross sections are provided, which increases the capacity of the semiconductor memory device by a factor corresponding to the number of the memory cells.

By using the memory cells arranged underneath the region where the cross sections are provided, as redundant cells, the yield of the semiconductor memory device can be improved.

By providing an equalization circuit between the predetermined region of the semiconductor substrate and the reading section, the equalization circuit is kept away from the reference cells. This avoids the periodic pattern of the reference cells from becoming unstable due to the presence of the equalization circuit. Accordingly, stable reference potentials can be obtained.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
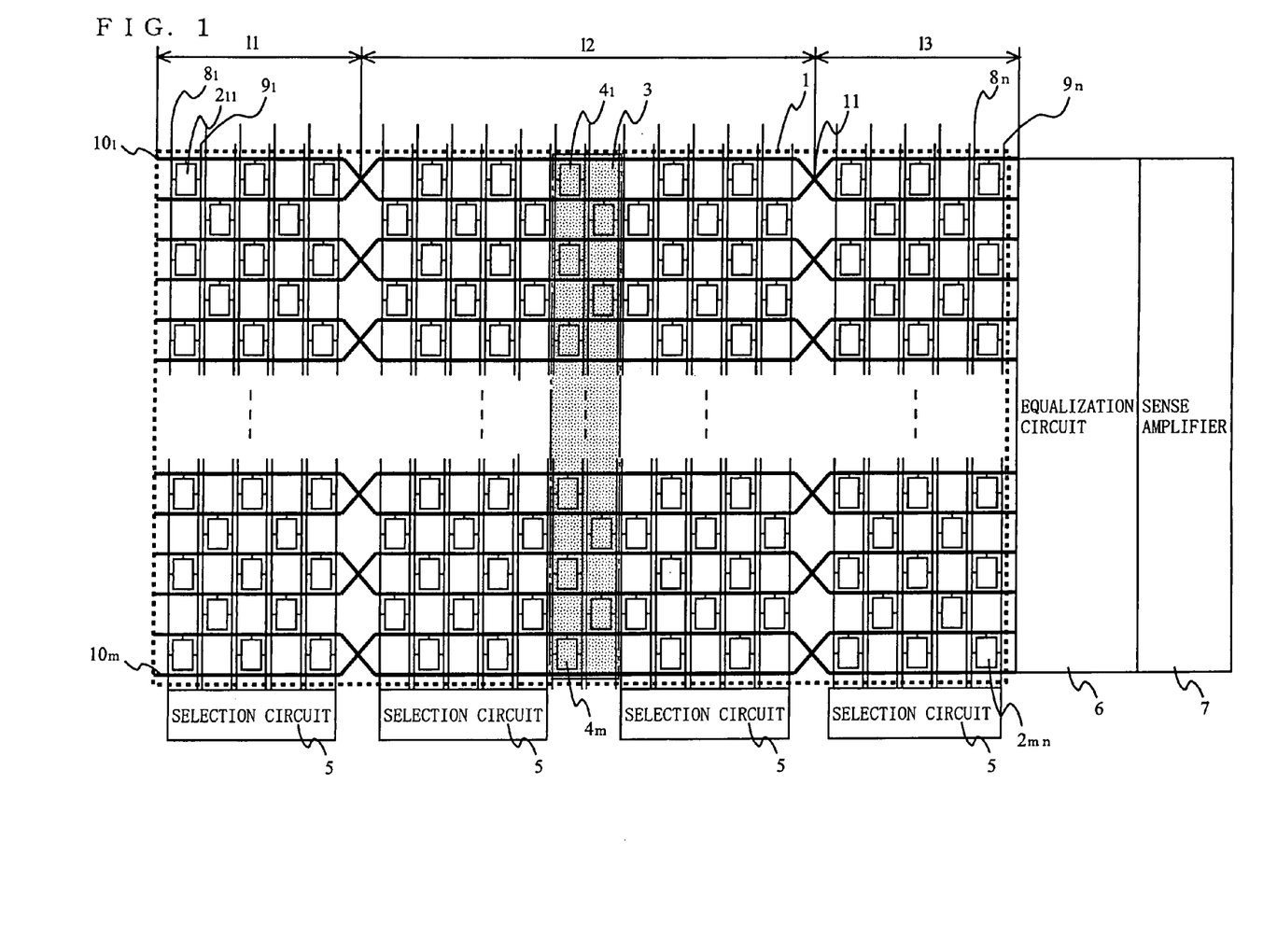
FIG. 1 is a diagram illustrating the entire configuration of a semiconductor memory device according to a first embodiment of the present invention.

Hereinafter, a semiconductor memory device according to a first embodiment of the present invention will be described with reference to the drawings. The semiconductor memory device according to the present embodiment is characterized in that reference cells are formed in a different region from where cross sections each having two bit lines crossing each other are provided. FIG. 1 is a diagram illustrating the entire configuration of the semiconductor memory device according to the present embodiment.

As shown in FIG. 1, the semiconductor memory device according to the present embodiment includes a memory cell region 1, a reference cell region 3, selection circuits 5, an equalization circuit 6, a sense amplifier 7, word lines 8, plate lines 9, and bit lines 10. In the memory cell region 1, a plurality of memory cells $2_{11}$ to $2_{mn}$ are arranged in a matrix form. The memory cells 2 each can store one bit of data, and is a ferroelectric memory cell which consists of one transistor and one capacitor (the so-called 1T1C).

The word lines $8_1$ to $8_n$ are arranged between the columns. The word lines 8 are connected to their corresponding memory cells 2, which are present in the same columns. In addition, the plate lines $9_1$ to $9_n$ are arranged between the columns in parallel with the word lines $8_1$ to $8_n$. The plate lines 9 are connected to their corresponding memory cells 2, which are present in the same columns. The word lines 8 and the plate lines 9 are connected to their corresponding selection circuits 5 arranged below the memory cell region.

The selection circuit 5 selects a memory cell 2 to read/write data, by controlling the potentials of the word line 8 and plate line 9 corresponding to the memory cell 2.

The reference cell region 3 is provided near the center of the memory cell region 1. Specifically, the reference cell region 3 is provided in a region near the centerline of the memory cell region 1 which is perpendicular to the bit lines 10. In the reference cell region 3, a plurality of reference cells $4_1$ to $4_m$ are arranged in a matrix form. The reference cells 4 each have the same structure as the memory cell 2, and have data "1" or "0" constantly stored therein. In the present embodiment, reference cells 4 on odd rows have data "1" stored therein, whereas reference cells 4 on even rows have data "0" stored therein.

The bit lines $10_1$ to $10_m$ are arranged between the rows which are composed of the memory cells 2 and the reference cells 4. The bit lines 10 have the memory cells 2 and the reference cells 4 connected thereto. Further, the bit lines 10 form pairs each composed of two adjacent bit lines 10, and two bit lines 10 in each pair are arranged in different layers. Specifically, as shown in FIG. 5B, bit lines 10 in a pair have a two-layer structure. Each pair of bit lines 10 has two cross sections 11 in the memory cell region 1. The cross section 11 is where two bit lines 10 in a pair change their positions; specifically, the cross section 11 has the configuration shown in FIG. 6. The cross sections 11 are provided such that the length (11+13) of a bit line 10 arranged in the upper layer is equal to the length (12) of the bit line 10 arranged in the lower layer. FIG. 1 shows an example case where a cross section 11 is provided in a location that is a quarter from the left side of bit lines 10 and in a location that is a quarter from the right side of the bit lines 10. By providing cross sections 11 such that the length of a bit line 10 arranged in the upper layer is equal to the length of the bit line 10 arranged in the lower layer, parasitic capacitances generated in the upper and lower layers become equal to each other in each bit line 10. Accordingly, all parasitic capacitances generated in the bit lines 10 become equal.

The bit lines 10 are each connected to the equalization circuit 6 present on the right side of the memory cell region 1. The equalization circuit 6 generates a reference potential by taking the average of the potentials of the reference cells 4 read through the bit lines 10. The reference potential is the mid-potential between the potential of a bit line 10 obtained when reading data "1" and the potential of a bit line 10 obtained when reading data "0". The reference potential is used to evaluate data stored in a memory cell 2.

The sense amplifier 7 detects a voltage which is the difference between the potential of a bit line 10 connected to a memory cell 2 selected to read data and a reference potential generated by the equalization circuit 6, and amplifies the voltage.

The operation of a semiconductor memory device configured as described above will be described below. The following describes the operation of the semiconductor memory device performed when reading data stored in a memory cell $2_{11}$.

When reading data stored in the memory cell $2_{11}$, first, the sense amplifier 7 sets a bit line $10_1$ to an open state (i.e., high impedance). After this, in order to select the memory cell $2_{11}$, a selection circuit 5 makes a word line $8_1$ active and raises the potential of a plate line $9_1$ to a high level, whereby if the data stored in the memory cell $2_{11}$ is "1", the potential of the bit line $10_1$ rises to a high level. If the data stored in the memory cell $2_{11}$ is "0", the potential of the bit line $10_1$ falls to a low level where the potential is relatively low.

In order to generate a reference potential, the equalization circuit 6 reads the potentials of reference cells 4 through bit lines 10 other than a bit line 10 being used to read the data. Specifically, in this embodiment, since the bit line $10_1$ is being used to read the data, the equalization circuit 6 reads the potentials of reference cells $4_2$ to $4_m$ through bit lines $10_2$ to $10_m$, and then takes the average of these potentials, thereby generating a reference potential.

The sense amplifier 7 generates a voltage which is the difference between the potential of the bit line $10_1$ and the reference potential generated by the equalization circuit 6, and outputs the voltage to an external circuit (not shown). Thereafter, using the voltage, the data stored in the memory cell $2_{11}$ is evaluated. Specifically, if the voltage outputted from the sense amplifier 7 is positive, the data stored in the memory cell $2_{11}$ is evaluated as "1". If the voltage outputted from the sense amplifier 7 is negative, the data stored in the memory cell $2_{11}$ is evaluated as "0".

As described above, according to the semiconductor memory device of the present embodiment, since the bit lines have a two-layer structure, the space between the bit lines can be narrowed, resulting in a reduction in the size of the semiconductor memory device. In addition, since each pair of bit lines has cross sections, all parasitic capacitances generated in the bit lines can be made equal. Accordingly, it is possible to solve various problems caused by parasitic capacitance.

Further, according to the semiconductor memory device of the present embodiment, the reference cells are arranged in a region near the center of the memory cell region, and the cross sections are provided in locations different from a location where the reference cells are arranged. This avoids the periodic pattern of the reference cells from becoming unstable caused by the cross sections and the reference cells overlapping one another. Accordingly, the reference cells can generate stable potentials.

Second Embodiment

Figure 2:
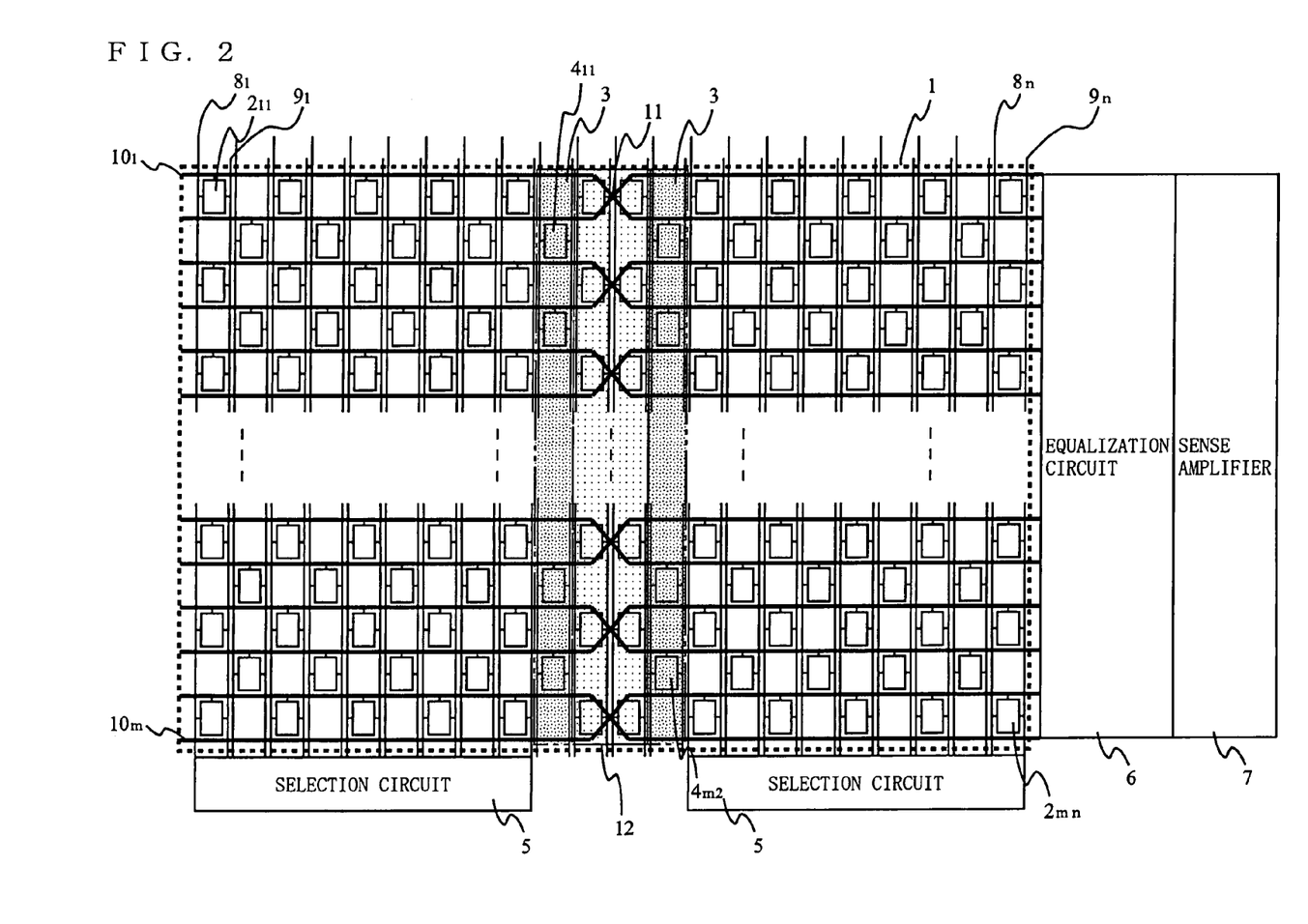
FIG. 2 is a diagram illustrating the entire configuration of a semiconductor memory device according to a second embodiment of the present invention.

Hereinafter, a semiconductor memory device according to a second embodiment of the present invention will be described with reference to the drawings. The semiconductor memory device according the present embodiment is different from the semiconductor memory device according to the first embodiment in locations where the cross sections and the reference cells are provided. Except for these differences, the configuration is the same as that of the first embodiment. FIG. 2 is a diagram illustrating the entire configuration of the semiconductor memory device according to the present embodiment.

As shown in FIG. 2, the semiconductor memory device according to the present embodiment includes a memory cell region 1, reference cell regions 3, selection circuits 5, an equalization circuit 6, a sense amplifier 7, word lines 8, plate lines 9, bit lines 10, and a dummy cell region 12. In the memory cell region 1, a plurality of memory cells $2_{11}$ to $2_{mn}$ are arranged in a matrix form. The memory cell region 1 and the memory cells 2 have the same configurations as those of the first embodiment, and thus any further descriptions thereof will be omitted here.

The word lines $8_1$ to $8_n$ are arranged between the columns. In addition, the plate lines $9_1$ to $9_n$ are arranged between the columns in parallel with the word lines $8_1$ to $8_n$. The word lines 8 and the plate lines 9 are connected to their corresponding selection circuits 5 arranged below the memory cell region. The word lines 8, the plate lines 9, and the selection circuits 5 have the same configurations as those of the first embodiment, and thus any further descriptions thereof will be omitted here.

The reference cell regions 3 have a plurality of reference cells $4_{11}$ to $4_{m2}$ arranged therein in a matrix form. Unlike the first embodiment, in the present embodiment, as shown in FIG. 2, two reference cell regions 3 are provided so as to sandwich a region which includes the center of the memory cell region 1. This configuration is employed because the cross sections 11 according to the present embodiment are arranged in the region which includes the center of the memory cell region 1, unlike the cross sections 11 according to the first embodiment.

The reference cells 4 each have the same configuration as the memory cell 2, and have data "1" or "0" constantly stored therein. In the present embodiment, reference cells 4 present in a reference cell region 3 on the left side each have data "1" stored therein, whereas reference cells 4 present in a reference cell region 3 on the right side each have data "0" stored therein.

The bit lines $10_1$ to $10_m$ are arranged between the rows which are composed of the memory cells 2 and the reference cells 4. The bit lines 10 have the memory cells 2 and the reference cells 4 connected thereto. Further, the bit lines 10 form pairs each composed of two adjacent bit lines 10, and two bit lines 10 in each pair are arranged in different layers. Specifically, as shown in FIG. 5B, bit lines 10 in a pair have a two-layer structure. Unlike the first embodiment, in the present embodiment, each pair of bit lines 10 has a cross section 11 on the centerline of the memory cell region 1. Note that since the cross section 11 is described in detail in the first embodiment, the description thereof will be omitted here. This configuration allows all parasitic capacitances generated in the bit lines 10 to become equal.

The dummy cell region 12 is present underneath the cross sections 11. In the dummy cell region 12, dummy cells which are inoperative and have the same structure as the memory cells 2 are arranged in a matrix form.

The bit lines 10 are each connected to the equalization circuit 6 present on the right side of the memory cell region 1. Note that since the equalization circuit 6 has the same configuration as that of the first embodiment, any further description thereof will be omitted here. Likewise, since the sense amplifier 7 has the same configuration as that of the first embodiment, any further description thereof will be omitted here.

The operation of a semiconductor memory device configured as described above will be described below. The following describes the operation of the semiconductor memory device performed when reading data stored in a memory cell $2_{11}$.

When reading data stored in the memory cell $2_{11}$, first, the sense amplifier 7 sets the bit line $10_1$ to an open state (i.e., high impedance). After this, in order to select the memory cell $2_{11}$, a selection circuit 5 makes a word line $8_1$ active and raises the potential of a plate line $9_1$ to a high level, whereby if the data stored in the memory cell $2_{11}$ is "1", the potential of the bit line $10_1$ rises to a high level. If the data stored in the memory cell $2_{11}$ is "0", the potential of the bit line $10_1$ falls to a low level where the potential is relatively low.

In order to generate a reference potential, the equalization circuit 6 reads the potentials of reference cells 4 through bit lines 10 other than a bit line 10 being used to read the data. Specifically, in this embodiment, since the bit line 101 is being used to read the data, the equalization circuit 6 reads the potentials of reference cells $4_{11}$ to $4_{m2}$ through bit lines $10_2$ to $10_m$, and then takes the average of these potentials, thereby generating a reference potential.

The sense amplifier 7 generates a voltage which is the difference between the potential of the bit line $10_1$ and the reference potential generated by the equalization circuit 6, and outputs the voltage to an external circuit (not shown). Thereafter, using the voltage, the data stored in the memory cell $2_{11}$ is evaluated. Specifically, if the voltage outputted from the sense amplifier 7 is positive, the data stored in the memory cell $2_{11}$ is evaluated as "1". If the voltage outputted from the sense amplifier 7 is negative, the data stored in the memory cell $2_{11}$ is evaluated as "0".

According to the semiconductor memory device of the present embodiment, as with the semiconductor memory device according to the first embodiment, a reduction in the size of the semiconductor memory device is achieved. In addition, since each pair of bit lines has a cross section, all parasitic capacitances generated in the bit lines can be made equal, as with the semiconductor memory device according to the first embodiment.

Further, according to the semiconductor memory device of the present embodiment, as with the semiconductor memory device according to the first embodiment, it is possible to avoid the periodic pattern of the reference cells from becoming unstable caused by the cross sections and the reference cells overlapping one another. Accordingly, the reference cells can generate stable potentials.

Moreover, according to the semiconductor memory device of the present embodiment, each pair of bit lines has only one cross section, which facilitates the formation of bit lines.

Figure 3:
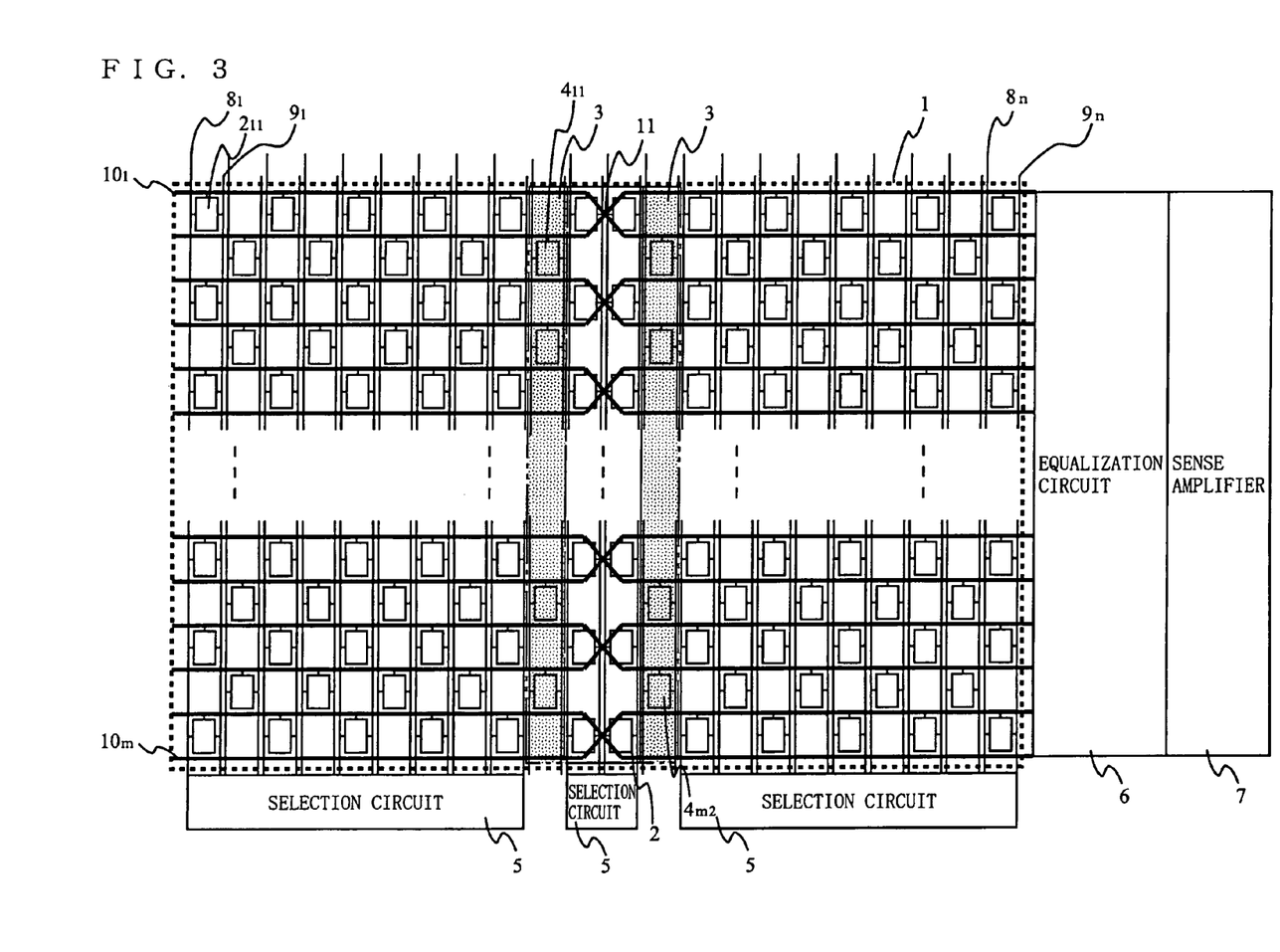
FIG. 3 is a diagram illustrating the entire configuration of another semiconductor memory device according to the second embodiment of the present invention.

In the semiconductor memory device according to the present embodiment, as shown in FIG. 2, dummy cells are provided in a region underneath the cross sections. In another configuration, it is also possible to provided memory cells in the region underneath the cross sections, for example. This configuration will be briefly described below with reference to FIG. 3. FIG. 3 is a diagram illustrating the entire configuration of a semiconductor memory device having memory cells provided underneath cross sections.

Generally, the memory cell 2 does not require as strict a periodic pattern as the reference cell 4. Thus, in the semiconductor memory device shown in FIG. 3, memory cells 2 are also arranged in a matrix form in a region underneath cross sections 11. In order to select these memory cells, the lower ends of their corresponding word lines and plate lines are connected to a selection circuits 5. By thus arranging the memory cells 2 in the region underneath the cross sections 11, the capacity of the semiconductor memory device can be increased.

It is also possible to use the memory cells 2 arranged in the region underneath the cross sections 11 as the redundant cells in the case of a failure of memory cells 2 arranged in the memory cell region 1. This makes it possible to improve the yield of the semiconductor memory device.

In addition, in the case where the memory cells 2 arranged in the region underneath the cross sections 11 are implemented on a test chip, these memory cells 2 may be used as redundant cells in the case of a failure of the reference cells, and in addition the parasitic capacitance of the bit lines generated in a read operation may be increased or decreased, whereby efficient data evaluation is achieved.

Although in the semiconductor memory devices according to the first and second embodiments, bit lines in each pair have a two-layer structure, all the bit lines may be arranged in the same layer. In this case too, it is possible to achieve a reduction in the size of a semiconductor memory device in which the reference cells are arranged in a region near the center of the memory cell region. This configuration will be described in detail below.

As shown in FIG. 5A, typically, adjacent bit lines are arranged with a given space therebetween, thereby preventing the adverse effects of noise from the adjacent bit lines. Alternatively, by providing a cross section to bit lines, it is also possible to improve the noise immunity of the bit lines. That is, even in a semiconductor memory device in which all bit lines are arranged in the same layer, by allowing adjacent bit lines to cross each other, as is the case with the first and second embodiments, the space between the bit lines can be narrowed, resulting in a reduction in the size of the semiconductor memory device.

In the first and second embodiments, lining may be performed on the bit lines in a region other than a region where the reference cells are arranged.

While the invention has been described in detail, the foregoing description is in all aspects illustrative and not restrictive. It is understood that numerous other modifications and variations can be devised without departing from the scope of the invention.

What is claimed is:

1. A semiconductor memory device having a semiconductor substrate, comprising:
a plurality of memory cells for storing data, arranged in a matrix form in a predetermined region of the semiconductor substrate;
a plurality of reference cells for generating predetermined potentials to generate a reference potential for evaluating data stored in a memory cell; and
a plurality of bit lines through which potentials of the memory cells and the reference cells are read, the bit lines being arranged in parallel with each other,
wherein
the reference cells are formed in a region near a centerline of the predetermined region of the semiconductor substrate, the centerline being perpendicular to the bit lines,
the bit lines form pairs each composed of two adjacent bit lines,
two bit lines in each pair have a first parallel state and a second parallel state in which positions of the two bit lines are reversed from the first parallel state,
each pair of bit lines has at least one cross section where one of the pair of bit lines crosses the other, to switch between the first parallel state and the second parallel state; and
the cross sections are each provided in the predetermined region of the semiconductor substrate such that a length of a bit line in the first parallel state is equal to a length of the bit line in the second parallel state.

2. The semiconductor memory device according to claim 1, wherein two bit lines in each pair are formed in different wiring layers.

3. The semiconductor memory device according to claim 1, wherein
the cross sections are provided on the centerline of the predetermined region of the semiconductor substrate, and
the reference cells are arranged in regions near the centerline of the predetermined region of the semiconductor substrate and sandwiching a region where the cross sections are provided.

4. The semiconductor memory device according to claim 3, wherein a plurality of memory cells for storing data are arranged in a region of the semiconductor substrate underneath the region where the cross sections are provided.

5. The semiconductor memory device according to claim 4, wherein the memory cells arranged in the region underneath the region where the cross sections are provided are redundant cells used in the case of a failure of the memory cells arranged in the predetermined region of the semiconductor substrate.

6. The semiconductor memory device according to claim 1, further comprising:
an equalization circuit having the plurality of bit lines connected thereto, for taking an average of predetermined potentials of reference cells connected to bit lines other than a bit line to which the memory cell is connected; and
a reading section having the plurality of bit lines connected thereto, for reading the data by comparing a potential of the memory cell with the average of the predetermined potentials obtained by the equalization circuit.

7. The semiconductor memory device according to claim 6, wherein the equalization circuit is arranged between the predetermined region of the semiconductor substrate and the reading section.

* * * * *